(12) United States Patent
Masuda et al.

(10) Patent No.: US 8,486,756 B2
(45) Date of Patent: Jul. 16, 2013

(54) FLIP CHIP BONDED SEMICONDUCTOR DEVICE WITH SHELF AND METHOD OF MANUFACTURING THEREOF

(75) Inventors: Naomi Masuda, Kanagawa (JP); Koji Taya, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 461 days.

(21) Appl. No.: 12/343,348

(22) Filed: Dec. 23, 2008

(65) Prior Publication Data

US 2009/0200684 A1    Aug. 13, 2009

(30) Foreign Application Priority Data

Dec. 28, 2007    (JP) ................................. 2007-339935

(51) Int. Cl.
*H01L 21/60*    (2006.01)
(52) U.S. Cl.
USPC ........... 438/106; 438/108; 438/460; 438/463; 257/E21.511

(58) Field of Classification Search
USPC .................................. 438/462, 108, 113–114
See application file for complete search history.

(56) References Cited

U.S. PATENT DOCUMENTS

| | | | | |
|---|---|---|---|---|
| 6,049,124 A | * | 4/2000 | Raiser et al. | 257/712 |
| 6,580,152 B2 | * | 6/2003 | Hasegawa | 257/618 |
| 7,405,100 B1 | * | 7/2008 | Mostafazadeh et al. | 438/68 |
| 7,691,726 B2 | * | 4/2010 | Seng | 438/462 |
| 2002/0024628 A1 | * | 2/2002 | Walker et al. | 349/155 |
| 2007/0145547 A1 | * | 6/2007 | McKerreghan et al. | 257/676 |
| 2007/0257365 A1 | * | 11/2007 | Lu et al. | 257/737 |

* cited by examiner

*Primary Examiner* — Thanh Nguyen

(57) ABSTRACT

The semiconductor device according to the present invention has a planar semiconductor chip having projecting connection terminals provided on one surface thereof. A shelf is provided where a peripheral edge of a surface of the semiconductor chip opposite one surface thereof onto which connection terminals are provided is removed. This makes it possible to secure a larger volume of the fillet portion of the underfill, thereby helping improve the function of preventing the rising up of the excess underfill by providing a shelf in the semiconductor chip.

18 Claims, 8 Drawing Sheets

(a)

(b)

(c)

(d)

(e)     (f)

| | 100 μm DIE | | | | 200 μm DIE | | | |
|---|---|---|---|---|---|---|---|---|
| | FRONT SURFACE DOUBLE CUT | | BACK SURFACE DOUBLE CUT | | FRONT SURFACE DOUBLE CUT | | BACK SURFACE DOUBLE CUT | |
| | DIE LOWER PORTION | FILLET PORTION | DIE LOWER PORTION | FILLET PORTION | DIE LOWER PORTION | FILLET PORTION | DIE LOWER PORTION | FILLET PORTION |
| RESPECTIVE CROSS-SECTIONAL AREAS FOR UNDERFILL (mm²) | a 0.25 | b 0.007 | c 0.25 | d 0.013 | 0.25 | 0.016 | 0.25 | 0.042 |
| RESPECTIVE VOLUMES OF UNDERFILL (mm³) | e 2.5 | f 0.28 | g 2.5 | h 0.52 | 2.5 | 0.64 | 2.5 | 1.68 |
| OVERALL VOLUME OF UNDERFILL (mm³) | i 2.78 | | j 3.02 | | 3.14 | | 4.18 | |
| FILLET PORTION VOLUME RATIO (%) | k 10.0 | | l 17.2 | | 20.4 | | 40.2 | |

※ DIE SIZE (LENGTH×WIDTH) : 10x10mm
DOUBLE CUT STEP (LENGTH, WIDTH) : 0.003mm each
DOUBLE CUT STEP (HEIGHT) : DIE THICKNESS/2

FIG. 4

| 300 μm DIE | | | | 400 μm DIE | | | |
|---|---|---|---|---|---|---|---|
| FRONT SURFACE DOUBLE CUT | | BACK SURFACE DOUBLE CUT | | FRONT SURFACE DOUBLE CUT | | BACK SURFACE DOUBLE CUT | |
| DIE LOWER PORTION | FILLET PORTION | DIE LOWER PORTION | FILLET PORTION | DIE LOWER PORTION | FILLET PORTION | DIE LOWER PORTION | FILLET PORTION |
| 0.25 | 0.029 | 0.25 | 0.089 | 0.25 | 0.047 | 0.25 | 0.152 |
| 2.5 | 1.16 | 2.5 | 3.56 | 2.5 | 1.88 | 2.5 | 6.08 |
| 3.66 | | 6.06 | | 4.38 | | 8.56 | |
| 31.7 | | 58.7 | | 42.9 | | 70.9 | |

←-------- continued from page 4/8 --------→

FIG. 4 continued

FLIP CHIP BONDED SEMICONDUCTOR DEVICE WITH SHELF AND METHOD OF MANUFACTURING THEREOF

CLAIM OF PRIORITY

This application claims priority from Japanese patent application 2007-339935 filed on Dec. 28, 2007.

TECHNICAL FIELD

This invention relates to a semiconductor device, and in particular to a semiconductor device and a manufacturing method thereof realized by directly mounting a semiconductor chip to a substrate by using projecting connection terminals (electrodes) which are arranged on one surface of a planar semiconductor chip.

BACKGROUND

The development of smaller, highly sophisticated consumer electronics has increased demands for compact and low-profiled semiconductor chips used in consumer electronic devices correspondingly. To accommodate this increase in demand, a connection method to connect a semiconductor chip and the substrate in the semiconductor device has been developed which is referred to as flip chip bonding. In traditional wire bonding techniques, the chip and the substrate are connected by wires, with a surface of the chip facing upwards, upon which connection terminals are provided. With flip chip bonding, protruding connection terminals referred to as "bumps" are provided on the chip. The chip is reversed (flipped) so that the bumps are on the lower surface and are thus directly connected to the substrate.

With flip chip bonding, the area at the bump periphery between the chip and the substrate is filled with a thermosetting resin referred to as "underfill" for reinforcement. However, mounting using flip chip bonding poses a problem that this underfill material would often crawl up. This is depicted with reference to FIG. 1. FIG. 1 shows one example of mounting using flip chip bonding. As shown in FIG. 1, the front surface (circuit forming surface) 11 of chip 1 functions as the lower surface, while the back surface (surface opposite the circuit forming surface) 12 of chip 1 functions as the upper surface. Bumps 2 are arrayed on a front surface 11 of chip 1. The circuit formed in chip 1 and the circuit of the substrate 3 are connected through bumps 2.

When mounting chip 1 onto the substrate 3, an underfill 4 is coated in advance at locations where chip 1 is to be fixed to the substrate 3, for instance. Chip 1 is picked up by a bonding head 5 and is mounted at the fixing location of chip 1 on the substrate 3 onto which the underfill 4 is coated. Then, pressure and heat are applied from above by the bonding head 5. As a result, the underfill 4—which is typically a thermosetting resin—cures, thereby fixing the chip 1 to substrate 3.

If the coated amount of underfill 4 is small, there is a risk that the underfill 4 will not sufficiently reach the periphery of bumps 2. This means that the underfill 4 must be coated in larger amounts to a certain degree. On the other hand, if the underfill 4 is coated in large amounts, the excess underfill 4 sticks out at the periphery of chip 1. The part of underfill 4 that sticks out is referred to as a "fillet portion." If the volume of the fillet portion is large, the underfill 4 may rise and coat the side surface(s) of chip 1 as shown in FIG. 1 and adhere to the bonding head 5.

If the underfill 4 adheres to the bonding head 5, the chip 1 may be lifted to some degree, thereby causing shearing to occur in bumps 2 when the bonding head 5 is pulled up after mounting is completed. Furthermore, the underfill 4 that adhered cures and damages the flatness of the bonding head 5, thereby causing a drop in the quality of flip chip products.

FIG. 2 discloses a conventional technique to solve the problems caused by the underfill 4 rising up.

However, in conventional techniques for preventing the rise and coating of the underfill 4, the peripheral edge of the front surface 11 of chip 1 is removed to provide a ledge at the periphery of the front surface 11. This ledge prevents the underfill 4 from rising up and coating the side surface of the chip 1.

However, the fillet portion of the underfill 4 may exceed the ledge formed at the periphery of the front surface 11 of chip 1. The ledge formed at the periphery of the front surface 11 of chip 1 may therefore be insufficient with respect to the volume of the fillet portion, thereby creating a problem that coating of the side surfaces of the chip 1 cannot be prevented.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

The semiconductor device according to the present invention has a planar semiconductor chip having protruding connection terminals provided on one surface thereof. The semiconductor chip also has a shelf provided where a peripheral edge is removed on a surface thereof opposite the surface having connection terminals provided thereon.

A fillet portion of underfill with a larger volume can thus be managed, thereby enhancing the function of preventing underfill crawl up by providing a shelf in the semiconductor chip.

According to one embodiment, a semiconductor device is manufactured having a planar semiconductor chip with projecting connection terminals provided on one surface thereof. A wafer is diced from a surface opposite the surface onto which a plurality of circuits is formed, thus forming individual chips from the wafer.

As a result, a shelf is provided where the peripheral edge is removed from a surface opposite the one surface of the semiconductor chip onto which connection terminals are provided. This enables manufacturing in which problems caused by the underfill crawling up are more reliably prevented when mounting using flip chip bonding.

According to the semiconductor device and the manufacturing method thereof according to embodiments of the present invention, problems caused by the underfill coating the side surfaces of a chip can be more reliably prevented when mounting using flip chip bonding.

BRIEF DESCRIPTION OF THE DRAWINGS

The accompanying drawings, which are incorporated in and form a part of this specification, illustrate embodiments of the invention and, together with the description, serve to explain the principles of the invention;

FIG. 4 depicts a table of data estimating the ratio of the volume of the fillet portion to the overall volume of the underfill, in accordance with various embodiments;

DETAILED DESCRIPTION

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known processes, procedures, components, and circuits have not been described in detail as not to unnecessarily obscure aspects and features of the subject matter.

Figure 1:
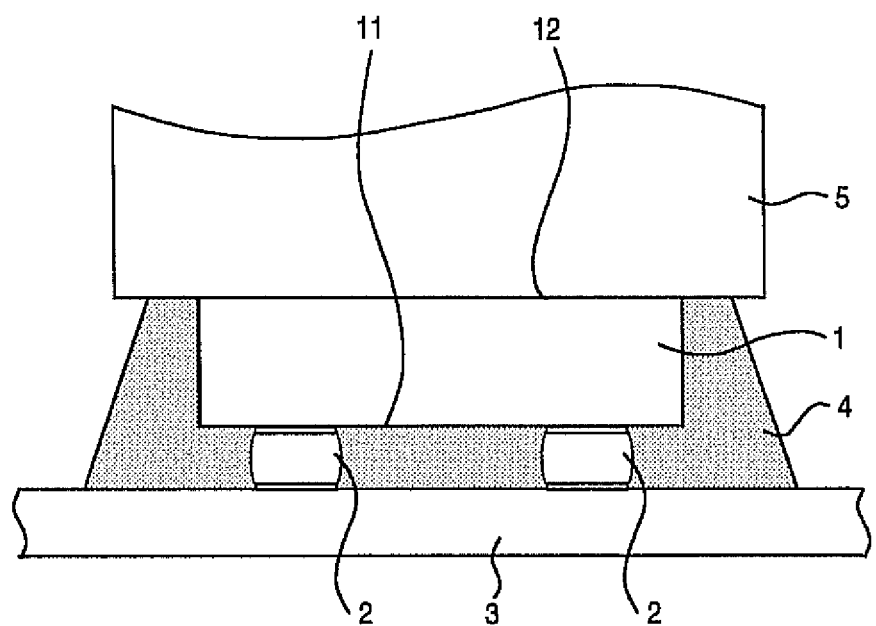
FIG. 1 is a diagram depicting mounting using flip chip bonding, in accordance with various embodiments.
Figure 2:
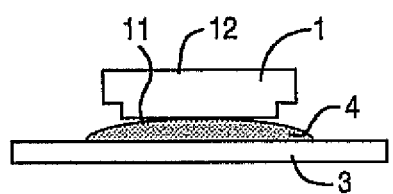
FIG. 2a is a graphical depiction of a first state in a conventional flip chip bonding technique.
FIG. 2b is a graphical depiction of a second state in a conventional flip chip bonding technique.
FIG. 2c is a graphical depiction of a third state in a conventional flip chip bonding technique.
FIG. 2d is a graphical depiction of a fourth state in a conventional flip chip bonding technique.
FIG. 2e is a graphical depiction of a potential fifth state in a conventional flip chip bonding technique.
FIG. 2f is a graphical depiction of a potential fifth state in a conventional flip chip bonding technique.
Figure 2:
Figure 2:
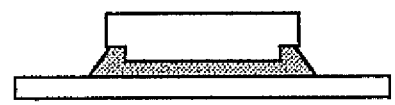
Figure 2:
Figure 2:
Figure 2:
Figure 2:
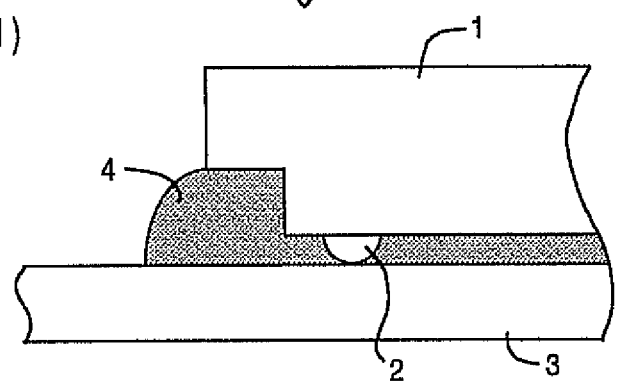
Figure 2:
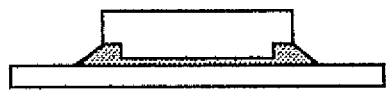
Figure 2:
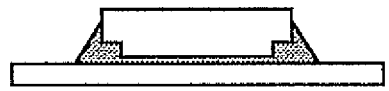
Figure 3:
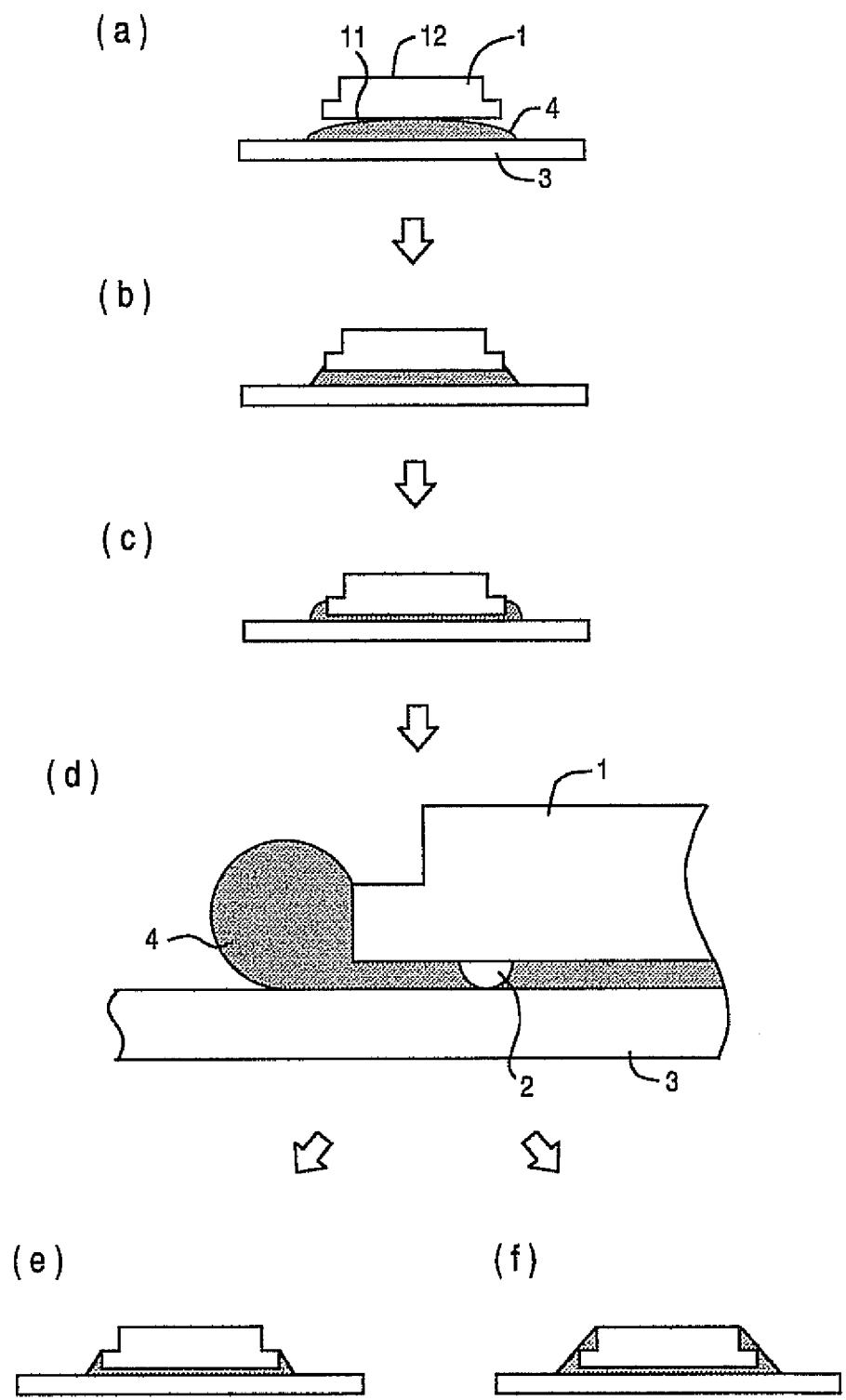
FIG. 3a is a graphical depiction of a first state in a method for flip chip bonding in accordance with various embodiments.
FIG. 3b is a graphical depiction of a second state in a method for flip chip bonding in accordance with various embodiments.
FIG. 3c is a graphical depiction of a third state in a method for flip chip bonding in accordance with various embodiments e.
FIG. 3d is a graphical depiction of a fourth state in a method for flip chip bonding in accordance with various embodiments.
FIG. 3e is a graphical depiction of a potential fifth state in a method for flip chip bonding in accordance with various embodiments.
FIG. 3f is a graphical depiction of a potential fifth state in a method for flip chip bonding in accordance with various embodiments.

With reference now to FIG. 3, one embodiment of the present invention will be described in comparison to conventional techniques, as depicted in FIG. 2. As presented in FIG. 3, an embodiment for flip chip bonding as described in the invention is depicted, showing the degree to which the underfill 4 expands. In FIG. 2(a) and FIG. 3(a), chip 1 is mounted at the fixing location of chip 1 on the substrate 3 onto which an underfill 4 is coated. Thereafter, pressure and heat are applied on chip 1 from above, as shown in FIG. 2(b), (c) and FIG. 3(b), (c), which makes the underfill 4 stick out at the periphery of chip 1, thereby forming a fillet portion. FIG. 2(d) and FIG. 3(d) both show an enlarged view of the state that the volume of the fillet portion increases and the underfill 4 starts crawling up the side surface of the chip 1. The states following completion of the mounting process when the volume of the filet portion does not exceed the boundaries shown in FIG. 2(d) and FIG. 3(d) are shown in FIG. 2(e) and FIG. 3(e). The states following completion of the mounting process in the case the volume of the filet portion exceeds the boundaries shown in FIG. 2(d) and FIG. 3 (d) are respectively shown in FIG. 2(f) and FIG. 3(f).

As shown in FIG. 2, in the embodiment for flip chip bonding as described, a ledge is provided on the front surface (circuit forming surface) 11 of the chip 1. On the other hand, as shown in FIG. 3, in the embodiment of flip chip bonding as described in the invention, a shelf is provided on a back surface (surface opposite the circuit forming surface) 12 of chip 1. The shape of the filet portion in the state that the underfill 4 starts coating the side surface of chip 1 is completely circular in this invention, as shown in FIG. 3(d), as opposed to being ¼ circular as shown in FIG. 2(d) and corresponding to conventional techniques. Accordingly, in the present invention, a larger volume of the fillet portion can be secured in the state that the underfill 4 starts coating the side surface of the chip 1. Specifically, the function of preventing coating of the underfill 4 can be improved by providing a shelf in the chip 1.

The function of preventing the rising of underfill 4 by providing a shelf in chip 1 in the present invention is compared to the same function in the reference, and a description will be given on the effects of providing the shelf on the back surface of chip 1, according to the present invention, by referring to FIG. 4 through FIG. 6.

FIG. 4 shows one example of the results obtained by estimating the ratio of the volume of the fillet portion to the overall volume of the underfill 4 in the state that the underfill 4 starts coating the side surface of chip 1, taking as example the case that the size of chip 1 (die size) is 10 [mm21. FIG. 4 shows the estimated results for the case that the step is provided on the front surface (front surface double cut) and the case that the shelf is provided on the back surface (back surface double cut) of chip 1 having in turn a thickness (die thickness) of 100, 200, 300 and 400 [μm]. Here, double cutting is generally known as a method in which a shelf is formed on chip 1 and in which two cutting blades of different widths are used. More specifically, the present invention adopts the back surface double cut, whereas conventional techniques typically employ the front surface double cut.

Figure 5:
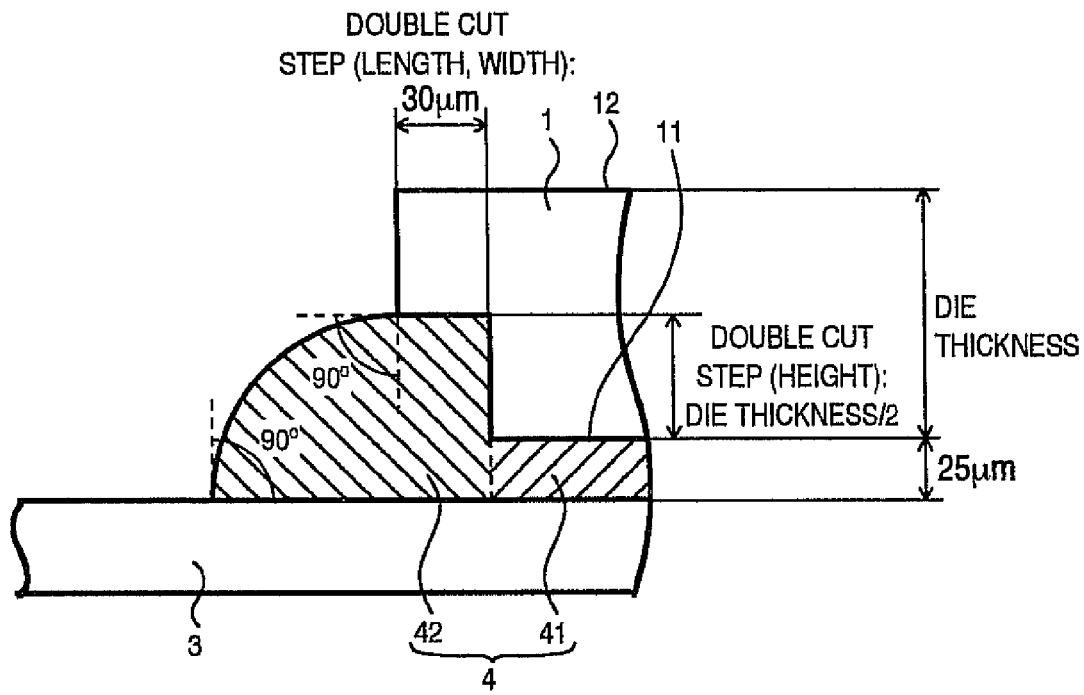
FIG. 5 is a cross-sectional diagram of a chip having front surface double cut.
Figure 6:
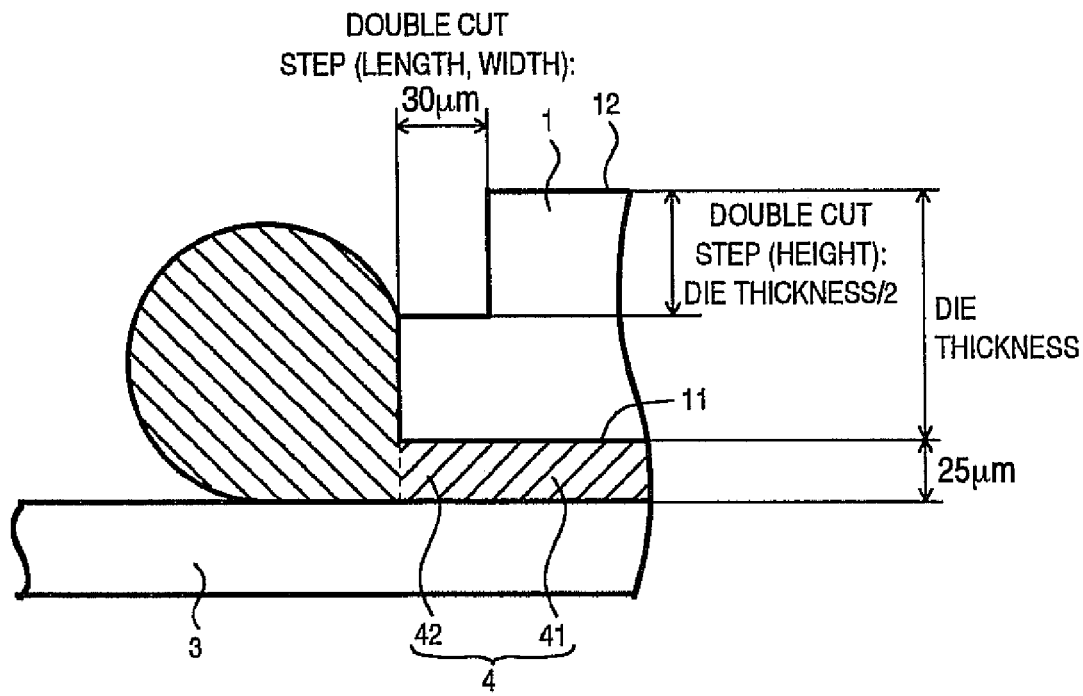
FIG. 6 is a cross-sectional diagram of a chip having a back surface double cut in accordance with various embodiments.

FIG. 5 and FIG. 6 are views for describing the method used to determine the estimated results shown in FIG. 4. FIG. 5 shows a part of a cross-sectional diagram corresponding to a front surface double cut, and FIG. 6 shows a part of a cross-sectional diagram corresponding to the back surface double cut. As shown in FIG. 5 and FIG. 6, in the estimated results of FIG. 4, the thickness (die thickness) of chip 1 is the distance between the front surface and the back surface of the chip 1. The double cut shelf (height) which has the height of the shelf formed by double cutting is calculated as die thickness/2. The double cut shelf which has the length of the shelf formed by double cutting in a longitudinal direction and lateral direction thereof (length, width) is calculated as 30 [μm]. The portion shown by oblique lines going upwards from left to right in underfill 4 represents a die lower portion 41 The portion shown by oblique lines going downwards from left to right in underfill 4 represents the fillet portion 42.

As shown in FIG. 5 and FIG. 6, the thickness of the die lower portion 41 in the estimated results in FIG. 4 is calculated as 25 [μm] both in the case of the front surface double cut and the back surface double cut. With the front surface double cut, the fillet portion 42 is approximated by an arc in which the contact angles between the chip 1 and the substrate 3 with the underfill 4 are 90 degrees as shown in FIG. 5. With the back surface double cut, the fillet portion 42 is approximated by an arc contacting chip 1 and substrate 3 as shown in FIG. 6. The cross-section area of the respective fillet portions 42 is calculated through the area calculating function provided in the general CAD software.

The estimated results of FIG. 4 are described more concretely taking as example the chip 1 having a thickness (die thickness) of 100 [μm], more specifically, 100 μm die. First, the cross-section area of each portion of the underfill 4 is calculated. With the front surface double cut, the cross section of the die lower portion 41 of the underfill 4 has a rectangular shape with the dimensions of 25 [μm] in length and a width obtained by subtracting the double cut shelf on both sides, in other words, 30 [μm]×2=60 [μm] from the die size of 10 [μm], as shown in FIG. 5. Accordingly, the relevant cross-section area is 0.025×(10−0.03×2)=0.25[mm$^2$] (a). With the back surface double cut, the cross section of the die lower portion 41 of the underfill 4 has a rectangular shape being 25 [μm] in length and 10 [mm] a width, which is the die size. Accordingly, the relevant cross-section area is 0.025×10=0.25 [mm$^2$] (c). With the front surface double cut and the back surface double cut, the cross-section areas of the fillet portion 42 of underfill 4 are 0.007 [mm$^2$] (b) and 0.013[mm$^2$] (d), which are determined through the area calculating function of the CAD software as was described above.

Next, the volume of each portion of the underfill 4 is calculated from the cross-section area. With the front surface double cut, the volume of the die lower portion 41 of underfill 4 is determined by multiplying its cross section area (a) by the length obtained by subtracting the double cut shelf on both sides, in other words, 30 [μm]×2=60 [μm] from the 10 [mm] which is the die size. Accordingly, the relevant volume becomes approximately 2.5 [mm$^3$] (e). With the back surface double cut, the volume of the die lower portion 41 of the underfill 4 is obtained by multiplying its cross section area (c) by the die size 10 [mm]. Accordingly, the relevant volume becomes 2.5 [mm$^3$] (g). With the front surface double cut and the back surface double cut, the volume of the fillet portion 42 of the underfill 4 is calculated by multiplying the relevant cross sectional area (b, d) by the length of four sides of chip 1, in other words, the die size 10[mmj×4=40 [μm]. With the front surface double cut, the relevant volume becomes 0.28 [mm$^3$] (f) and with the back surface double cut, the relevant volume becomes 0.52 [mm$^3$] (h).

The overall volume of the underfill 4 is calculated from the volume of each portion of underfill 4. The overall volume of the underfill 4 is determined by adding up the volumes (e, g) of the die lower portion 41 of the underfill 4 and the volumes (f, h) of the fillet portion 42. Accordingly, with the front surface double cut, the volume is 2.78 [mm$^3$] (i) and with the back surface double cut, the volume is 3.02 [mm$^3$] (j).

The fillet portion volume ratio which represents the ratio of the volume of the fillet portion 42 to the overall volume of underfill 4 is obtained by dividing the volume (f, h) of the fillet portion 42 by the overall volume (i, j) of 30 the underfill 4. Accordingly, with the front surface double cut, the ratio is approximately 10.0[%] (k), and with the back surface double cut, the ratio is approximately 17.2[%] (l).

The fillet portion volume ratios determined for the front surface double cut and the back surface double cut as was described are then compared. As can be noted, in any of the 100 μm die, the 200 μm die, the 300 μm die and the 400 μm die, the filet portion volume ratio for the back surface double cut is higher than that for the front surface double cut. Specifically, the ratio of the volume of the fillet portion 42 to the overall volume of the underfill 4 is high. When the rate of the volume of fillet portion 42 in the state that the underfill 4 starts rising up the side surface of chip 1 is high, this indicates that the amount of underfill 4 that may stick out at the periphery of chip 1 is large. Accordingly, as compared to the front surface double cut, with the back surface double cut according to the present invention, an improvement can be noted in the function of preventing the rising and coating of the underfill 4 by providing a shelf in chip 1.

Figure 7:
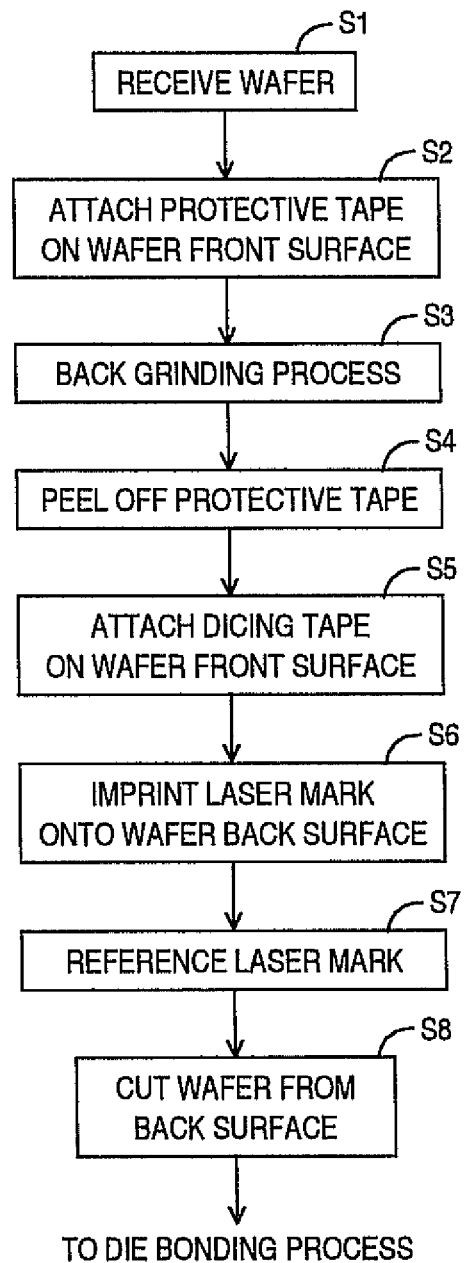
FIG. 7 is a flowchart of a semiconductor device manufacturing method in accordance with various embodiments.

FIG. 7 shows a flowchart of a semiconductor device manufacturing method according to the present invention. First, a wafer is received (S1). A protective tape is attached to the front surface (circuit forming surface) of the wafer that was received (S2). Next, a back grinding process is carried out to grind the wafer to a predetermined thickness (S3). In the back grinding process, the back surface of the wafer (surface opposite the circuit forming surface) is ground. After the back grinding process, the protective tape is peeled off (S4). Next, a dicing tape which will become the support body for the wafer and the chips (dice) which are diced from the wafer is attached to the front surface of the wafer (S5). In the present invention, the wafer is diced from its back surface to form individual chips from the wafer. Accordingly, the position of the wafer must be identified from the back surface of the wafer. To this end, a laser mark is imprinted onto the back surface of the wafer (56). The position of the wafer is identified by referencing the imprinted laser mark (S7), and the wafer is then cut into individual chips from its back surface (S8).

The chips diced from the back surface of the wafer as described above are flip-chip connected in a die bonding process in the next step. As a result of forming chips by dicing the wafer from its back surface, a shelf is provided where the peripheral edge of the surface opposite one surface of the semiconductor chip onto which connection terminals are provided is removed.

Thus, mounting using flip chip bonding enables manufacturing which can more reliably prevent problems caused by the underfill coating the side surfaces of the chip.

Figure 8:
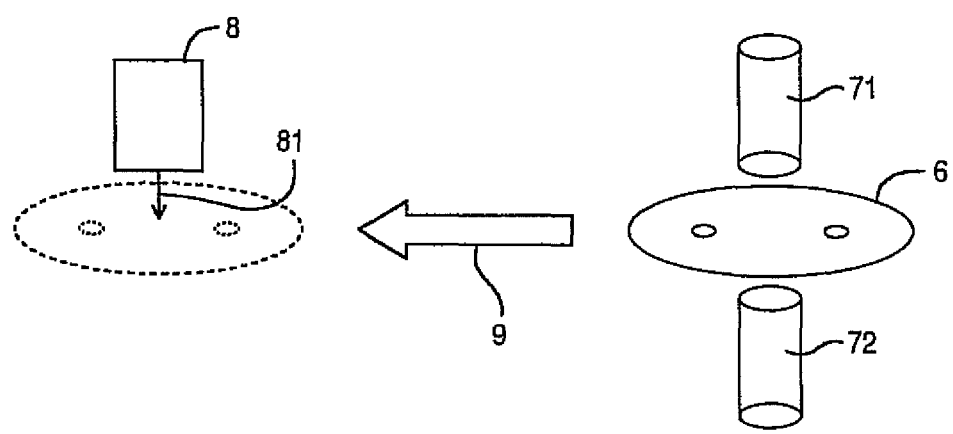
FIG. 8 is a schematic showing one example of the device for imprinting a laser mark on the wafer, in accordance with various embodiments.

A detailed description will now be given on the step of imprinting a laser mark on the back surface of the wafer (S6), from amongst the respective steps of the flow shown in FIG. 7, by referring to FIG. 8. FIG. 8 shows one schematic example of the device for imprinting laser marks on the wafer. This device has a dummy wafer 6 to be used for a running test, an upper camera 71, a lower camera 72, a laser irradiator 8 and an XY robot table 9.

The dummy wafer 6 has a through hole formed therein to allow confirmation. The dummy wafer 6 has its front surface facing downwards and its back surface facing upwards. The upper camera 71 serves to confirm the laser mark imprinted on the wafer. The lower camera 72 serves to recognize the circuit pattern on the surface of the wafer. The axis of the upper camera 71 with the lower camera 72 is detected using the dummy wafer 6. This detection includes numerical position correction. Next, the center positions of the upper camera 71 and the laser irradiator 8 are corrected. The laser 81 in the laser irradiator 8 makes an imprint at a specified position of the dummy wafer 6. The distance between the center positions of the upper camera 71 and the laser irradiator 8 is measured by confirming the imprinted laser mark using the upper camera 71, and is then corrected. The wafer is conveyed by the KY robot table 9.

Correction of the center positions of the upper camera 71 and the laser irradiator 8 includes correction of the convey errors caused by the XY robot table 9. The running test of the device is carried out using the dummy wafer 6 as described. As a result, using the upper camera 71, the lower camera 72 and the shift amount of the KY robot table 9, the circuit pattern on the front surface of the wafer is recognized, thereby allowing imprint of the laser mark at a random position of the back surface of the wafer. The wafer can be diced from its back surface by referencing the imprinted laser mark.

As was described in detail in the above text, according to the embodiment directed to the present invention, the wafer is diced from the back surface (surface opposite the circuit forming surface) to form individual chips from the wafer. As a result, a shelf is formed where the peripheral edge of the surface opposite the one surface of the semiconductor chip onto which connection terminals are formed is removed. Accordingly, a larger volume of the fillet portion of the underfill can be secured thereby improving the function of preventing rising up of the underfill by providing the shelf in the semiconductor chip.

In contrast to conventional techniques wherein the width of the double cut shelf cannot be made larger than the area which has no influence on the circuit pattern because the wafer is diced from its front surface (circuit forming surface). However, in the present invention, this constraint does not exist because the wafer is diced from its back surface.

Also, since the wafer is diced from its back surface in the present invention, the dicing tape which is conventionally attached to the back surface of the wafer is attached to the front surface of the wafer (refer to FIG. 7: S5). Accordingly, the protective tape which is attached to the front surface of the wafer (refer to FIG. 7: S2) prior to the back grinding process (refer to FIG. 7: S3) can be used as a dicing tape. Specifically, the processes of attaching and peeling off the tape can be eliminated. This helps reduce the mounting time and costs associated with the tape member.

The present invention is not limited to the embodiment described above, but needless to say, various improvements and modifications can be made thereto without departing from the scope of the present invention. For instance, the values of the die thickness, the double cut shelf, etc. are simply one example, and needless to say the invention is not limited to these values. The double cut shelf is sufficient as long as the fillet portion 42 does not touch the bonding head 5.

Although FIG. 4 through FIG. 6 show the calculation results in the case that double cutting is used as a method for forming a step in chip 1, the present invention is not limited to this. This method is sufficient if a shelf can be formed which allows to improve the function of preventing crawl up of the underfill 4 in chip 1. The structure of the shelf maybe an inclined surface, instead of the planar surface as is presented in the drawings.

In the present embodiment, the chip 1 is connected to the substrate 3, but this is not limited to this connection pattern. The chip 1 may also be connected with the package carrier such as a lead frame, etc., for instance, in addition to the substrate. The invention can also be applied to chip-on-chip mounting connecting the chips.

In the present embodiment, since the wafer is diced from the back surface, the position of the wafer is identified by referencing the laser mark imprinted on the back surface of the wafer as shown in FIG. 7 and FIG. 8. However, the invention is not limited to this. For instance, an infrared camera may be used to recognize the circuit pattern on the front surface of the wafer, from the back surface of the wafer, and this may be referenced later.

While the following exemplary configurations are shown as incorporating specific, enumerated features and elements, it is understood that such depiction is exemplary. Accordingly, embodiments are well suited to applications involving different, additional, or fewer elements, features, or arrangements.

What is claimed is:

1. A method for dicing a wafer from a planar semiconductor chip, comprising:
    receiving a wafer, the wafer comprising a portion of a surface of a planar semiconductor chip;
    grinding the wafer to a pre-determined thickness;
    attaching a dicing tape to the front surface of the wafer;
    determining a position in a back surface of the wafer by referencing a laser imprint on the back surface of the wafer;
    cutting a peripheral edge of the back surface of the wafer such that a surface area of the back surface of the wafer is less than a surface area of the front surface to form a shelf; and
    flip-chip bonding the wafer onto a substrate by mounting the front surface of the wafer to an underfill material disposed over the substrate,
    wherein the back surface of the wafer comprises the surface of the wafer opposite of the surface mounted on to the underfill material over the substrate,
    further wherein, the shelf substantially prevents an excess portion of the underfill material from coating side surfaces of the wafer.

2. The method of claim 1, wherein the back surface comprises a surface of the wafer opposite the front surface.

3. The method of claim 1, wherein the front surface comprises a surface of the planar semiconductor chip onto which a plurality of semiconductor circuits is formed.

4. The method of claim 1, wherein determining a position in a back surface of the wafer comprises:
    making a laser imprint on the back surface of the wafer.

5. The method of claim 4, wherein determining a position in a back surface of the wafer comprises using a dummy wafer for confirmation.

6. The method of claim 4, wherein the determining a position in a back surface of the wafer by referencing the laser imprint on the back surface of the wafer comprises referencing the laser imprint with a first camera positioned above the wafer.

7. The method of claim 1, wherein grinding the wafer to a pre-determined thickness comprises grinding the back surface of the wafer until a thickness of the wafer reaches the pre-determined thickness.

8. The method of claim 1, wherein cutting a peripheral edge of the back surface comprises forming individual chips from the back surface of the wafer.

9. The method of claim 8, further comprising:
    flip-chip bonding the individual chips diced from the back surface of the wafer.

10. The method of claim 1, wherein cutting a peripheral edge of the back surface of the wafer comprises forming a shelf over the front surface.

11. The method of claim 1, wherein cutting the back surface of the wafer comprises double cutting the back surface using a plurality of cutting blades of varying widths.

12. A method for dicing a wafer from a planar semiconductor chip for flip-chip bonding to a substrate, the method comprising:
- receiving a wafer, the wafer comprising a portion of a surface of a planar semiconductor chip;
- attaching a protective tape on a front surface of the wafer;
- grinding the wafer to a pre-determined thickness;
- removing the protective tape from the front surface of the wafer;
- attaching a dicing tape to the front surface of the wafer;
- making a laser imprint on the back surface of the wafer;
- determining a position in the back surface of the wafer by referencing the laser imprint on the back surface of the wafer;
- cutting a peripheral volume from a portion of the wafer comprising the back surface of the wafer such that a front volume of the wafer comprising the front surface has a greater surface area than a back volume comprising the peripheral volume, thereby creating a shelf; and
- flip-chip bonding the wafer onto a substrate by mounting the front surface of the wafer to an underfill material disposed over the substrate,
- wherein the back surface of the wafer comprises the surface of the wafer opposite of the surface mounted on the underfill material disposed over the substrate,
- further wherein, the shelf substantially prevents an excess portion of the underfill material from coating side surfaces of the wafer.

13. The method of claim 12, wherein cutting a peripheral volume comprises double cutting chips from a volume of the wafer comprising the back surface.

14. The method of claim 12, wherein a plurality of connection terminals are disposed on the front surface.

15. The method of claim 12, wherein flip-chip bonding the wafer onto the substrate comprises adhering the front surface to the underfill material via application of heat and pressure to the back surface of the wafer from a bonding head.

16. The method of claim 15, wherein mounting the wafer to the semiconductor chip creates the excess portion of the underfill material.

17. The method of claim 16, wherein the excess portion of the underfill material is substantially prevented from adhering to the bonding head.

18. The method of claim 12, wherein the determining a position in a back surface of the wafer by referencing the laser imprint on the back surface of the wafer comprises referencing the laser imprint with a first camera positioned above the wafer.

* * * * *